United States Patent [19]
Proebsting

[11] Patent Number: 5,793,383
[45] Date of Patent: Aug. 11, 1998

[54] SHARED BOOTSTRAP CIRCUIT

[75] Inventor: Robert J. Proebsting, Los Altos Hills, Calif.

[73] Assignee: Townsend and Townsend and Crew LLP, San Francisco, Calif.

[21] Appl. No.: 656,165

[22] Filed: May 31, 1996

[51] Int. Cl.$^6$ .............................. G09G 5/00; G11C 8/00
[52] U.S. Cl. ........................... 345/507; 365/230.03
[58] Field of Search .................................. 345/185, 196, 345/198, 507; 365/63, 230.01, 230.04, 230.06, 189.01, 189.05, 230.03, 226, 104; 326/88

[56] References Cited

U.S. PATENT DOCUMENTS

| | | | |
|---|---|---|---|
| 4,570,239 | 2/1986 | Carter et al. ........................... | 365/104 |
| 4,982,372 | 1/1991 | Matsuo ................................. | 365/230.06 |
| 5,097,441 | 3/1992 | Cho et al. ............................. | 365/230.06 |
| 5,265,050 | 11/1993 | McLaury ............................... | 365/230.06 |
| 5,276,650 | 1/1994 | Kubota ................................. | 365/63 |
| 5,285,407 | 2/1994 | Zagar et al. .......................... | 365/230.06 |
| 5,327,026 | 7/1994 | Hardee et al. ......................... | 326/88 |
| 5,363,339 | 11/1994 | Fujita ................................. | 365/230.06 |
| 5,428,577 | 6/1995 | Yumitori et al. ...................... | 365/230.06 |
| 5,517,456 | 5/1996 | Chishiki ............................... | 365/230.06 |
| 5,689,473 | 11/1997 | Toda ................................... | 365/230.06 |

*Primary Examiner*—Steven Saras
*Assistant Examiner*—Paul A. Bell
*Attorney, Agent, or Firm*—Townsend and Townsend and Crew LLP

[57] ABSTRACT

A memory device according to the invention includes at least first and second memory arrays having a number of word lines. Each of the word lines are coupled to a shared word line bootstrap circuit so that every word line from the first array shares a bootstrap circuit with a word line from the second array.

7 Claims, 2 Drawing Sheets

SHARED BOOTSTRAP CIRCUIT

BACKGROUND OF THE INVENTION

The present invention relates to semiconductor memories. More particularly, the present invention relates to word line bootstrap circuits used in semiconductor memories.

Random access semiconductor memories are an important and integral part of todays electronic systems. These memories are commonly arranged in a number of arrays, each array addressable by row and column decode circuitry. Row decoders select word lines while column decoders select bit lines. Existing random access semiconductor memory designs require that a booststrap circuit be coupled to each and every word line of each array of the memory device. These bootstrap circuits are designed to boost a selected word line from, e.g., $V_{ss}$ to $1.5*V_{cc}$. Those skilled in the art will recognize that a number of bootstrap circuits exist which may be used for this purpose. All, however, require the use of a capacitive circuit to store charge for the boost. That is, for every single word line in a memory array, a single capacitive bootstrap circuit is required.

The areal size of the bootstrap circuit, related to the capacitance needed, depends upon the number of bit and bit lines driven by a given word line. For example, in an array having 512 bit lines and 512 bit lines, a bootstrap circuit should be able to store sufficient charge to drive the 1024 total bit lines and the word line to, e.g., $1.5*V_{cc}$. A capacitive bootstrap circuit of this size, coupled to every word line in a memory can consume an economically significant amount of die area.

Considering that a typical array may include 256 to 512 word lines and that memories commonly are designed with a number of arrays (e.g., 16), the number of bootstrap circuits needed can be quite large. It is desireable to reduce the number of bootstrap circuits used in a memory design to free valuable die area.

One use for random access memories is to store video data. Video memory devices, such as video random access memories (RAMs) or frame buffer memories, have become an important and integral part of many computer systems. These devices often include a RAM portion to store data representing pixel data to be displayed on a display device. Thus, the RAM portion of the device is generally formed to have a bit width compatible with the display of a certain amount of pixel data. For example, many memory devices use a number of 256 bit wide memory arrays. 256 bits can, e.g., be used to represent 32 pixels having 8 bits of data, or can represent 16 pixels formed from 16 bits of data. This pixel data may be displayed on a cathode ray tube (CRT) screen or otherwise manipulated. Many of these video memories, however, are expensive to manufacture as they occupy a relatively large amount of die area. It is desireable to conserve the die area occupied by these video memories.

SUMMARY OF THE INVENTION

The present invention offers a memory device which occupies a smaller area than previous devices.

A memory device according to the invention includes at least first and second memory arrays each having a number of word lines. Each of the word lines are coupled to a shared word line bootstrap circuit so that every word line from the first array shares a bootstrap circuit with a word line from the second array.

Devices according to the invention may be implemented in memories having a number of arrays. Every pair of arrays uses common or shared bootstrap circuits, thereby reducing the number of capacitive bootstrap circuits by ½, resulting in a relatively substantial savings in die area.

In one embodiment, bootstrap circuits are shared in a video memory device which has a number of arrays. One group of arrays is designated to store video information for, e.g., a top portion of a display screen, while a second group of arrays is designated to store video information for, e.g., a bottom portion of the display screen. Arrays from the first group share bootstrap circuits with arrays from the second group. The result is a video memory implemented with a relatively substantial savings in die area.

For a fuller understanding of the nature and advantages of the invention, reference should be made to the ensuing description taken in conjunction with the accompanying drawings.

DESCRIPTION OF SPECIFIC EMBODIMENTS

Figure 1:
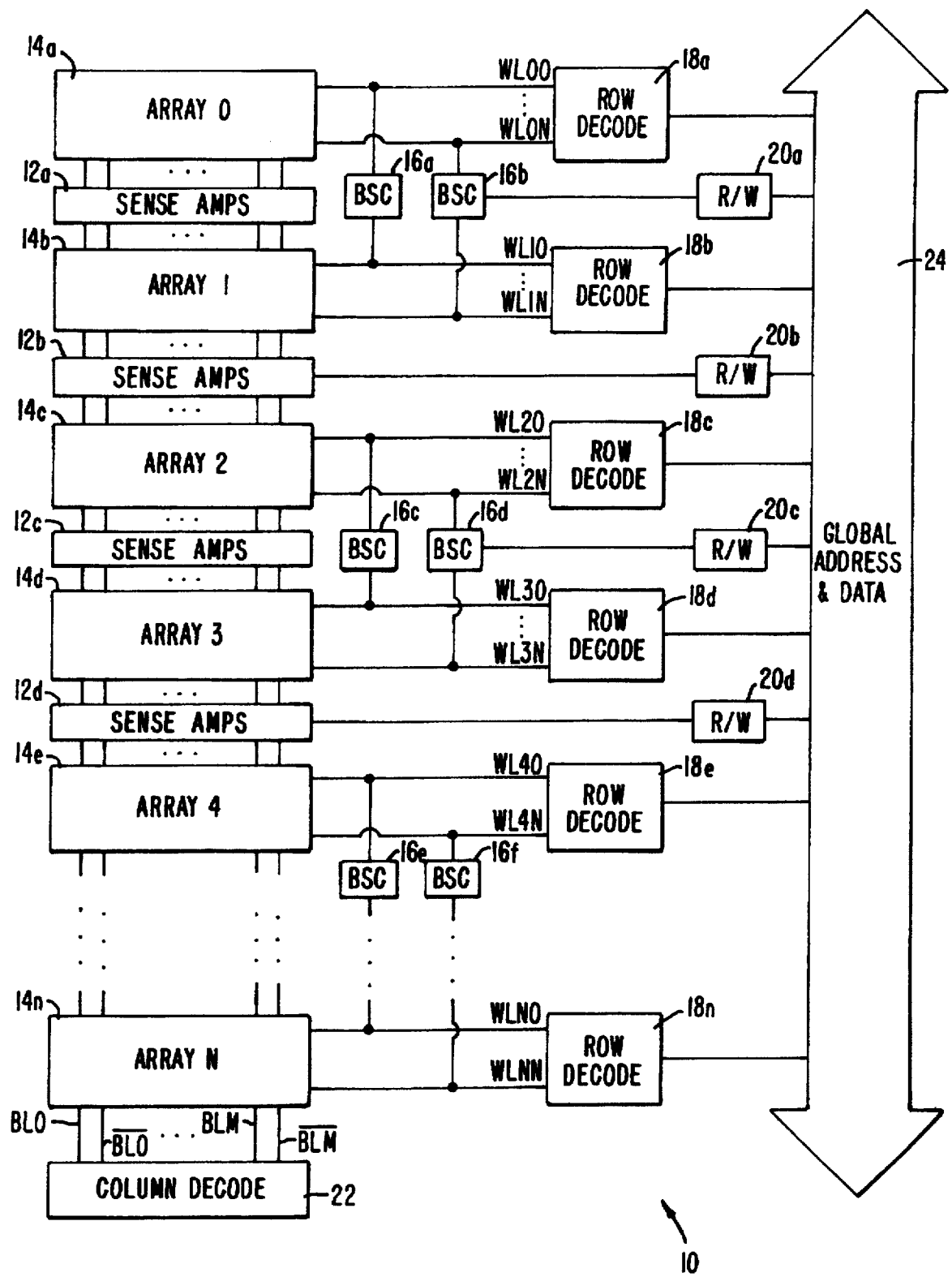
FIG. 1 is a block diagram depicting a generalized memory system using shared bootstrap circuits according to the present invention.

Features of the present invention will be discussed by first referring to FIG. 1 where a simplified portion of a typical memory device 10 is shown. The memory device 10 includes a number of memory arrays 14 addressed by row decode 18 and column decode 22 circuitry. The portion of memory device 10 shown may be implemented in any of a number of random access memory (RAM) architectures known to those skilled in the art. Preferably, memory device 10 is implemented in a video RAM or in a frame buffer memory adapted to store pixel information for processing or for display on a CRT screen.

The memory device 10 includes a number of arrays 14 (labelled ARRAY0-ARRAYN) having memory cells arranged in rows and columns. A number of configurations and arrangements of these arrays are known in the art, therefore a detailed description will not be given, instead, a simple column of arrays is shown for discussion. A row address signal is applied to a selected array 14 via a row address decoder 18. The row address decoder 18 selects a specific word line WL of a selected array. When a word line is selected, a bootstrap circuit 16 coupled to the word line boosts the word line from $V_{ss}$ to, e.g., $1.5*V_{cc}$. This voltage boost operates pass transistors along the selected word line, allowing charge stored in each memory cell to be passed to the bit and bit lines. Each bit and bit line combination is sensed by sense amplifier circuitry 12 to generate output signals amplified by read/write circuitry 20. The data may then be passed, e.g., to a CRT for display via global address and data lines 24. In the configuration depicted, the arrays are positioned so that neighboring arrays share sense amplifiers. This configuration is commonly known in the art and a detailed description will not be given. Further, those skilled in the art, upon reading this disclosure, will recognize that features of the present invention may be implemented in arrays which do not share sense amplifiers.

According to the invention, the bootstrap circuits 16 used are coupled to two separate word lines WL. That is, each bootstrap circuit 16 is shared by two memory arrays. For example, memory arrays ARRAY0 and ARRAY1 may share bootstrap circuits 16. Each word line of ARRAY0 shares a bootstrap circuit 16 with a corresponding word line in ARRAY1. For example, word line WL00 of ARRAY0 shares a bootstrap circuit 16a with word line WL10 of ARRAY1, while word line WL0N shares a bootstrap circuit 16b with word line WL1N. This reduces the number of capacitive bootstrap circuits by approximately ½ over previous designs, thereby freeing valuable die space.

In one embodiment, the memory arrays 14 are numbered such that every even numbered array (e.g., ARRAY0, ARRAY2, ARRAY4, etc.) shares bootstrap circuits with an odd numbered array (e.g., ARRAY1, ARRAY3, etc.), although any array numbering scheme may be used so long as arrays which share bootstrap circuits are not selected simultaneously.

Figure 2:
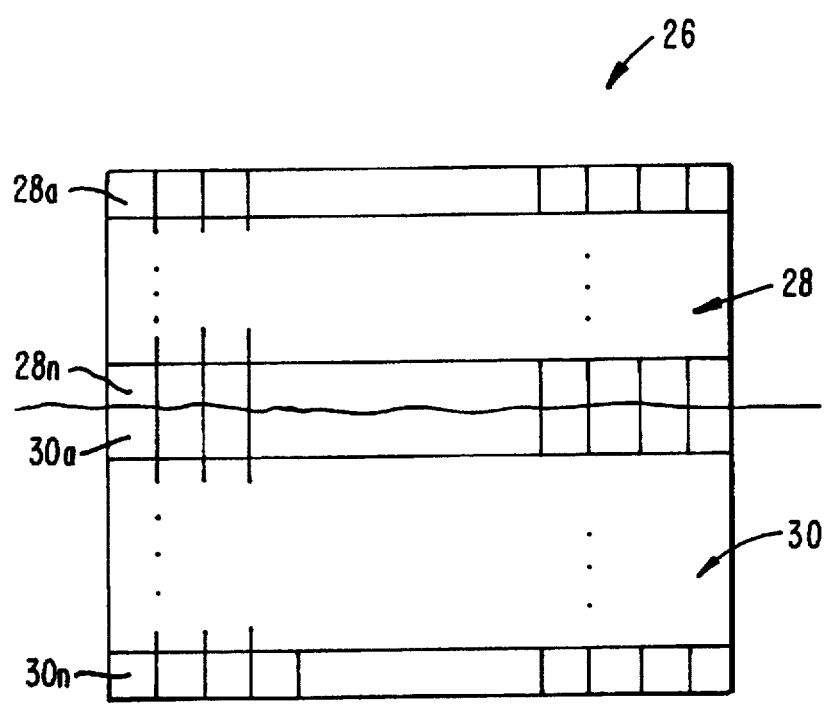
FIG. 2 illustrates a display screen divided into portions for use with the memory system of FIG. 1.

One approach to ensuring that adjacent arrays are not simultaneously selected will now be described by referring to FIG. 2, where a CRT screen 26 is shown. Data stored in video memories are often organized for convenient display on a CRT screen. A row of memory may, e.g., consist of 16-bit information designed to display a specific group of pixels on the CRT screen. In one embodiment of the present invention, the CRT screen 26 is defined as having a top half 28 and a bottom half 30. Data from even numbered arrays (e.g., ARRAY0, ARRAY2, ARRAY4, etc.) is displayed in the top half 28 of the CRT 26, while data from the odd numbered arrays (e.g., ARRAY1, ARRAY3, etc.) is displayed in the bottom half 30 of the CRT 26. If the memory device 10 is addressed for the display of any information in the top half of the screen 28, one of the even numbered arrays will be addressed. None of the odd numbered arrays will be addressed for that request. This permits the word lines WL for adjacently numbered arrays (e.g., ARRAY0 and ARRAY1) to share bootstrap circuits 16, as ARRAY0 will not be selected at the same time as ARRAY1 and vice versa. The result is a savings in valuable die space.

As an example, assume that data from the first row (WL00) of ARRAY0 is designated to be output on a first row 28a of the top half 28 of the CRT 26 and that data from the first row (WL10) of ARRAY1 is designated to be output on row 30a of the CRT screen 26. When row 28a of the CRT 26 is to be refreshed, ARRAY0 is accessed, and the row decode circuitry 18a asserts word line WL00. Word line WL00 is boosted by bootstrap circuit 16a. Although bootstrap circuit 16a is also shared by word line WL10, there is no chance that both word lines will be asserted at the same time, as the data from the two word lines is designated to be display on different portions of the CRT screen 26. The remainder of the CRT screen 26 and the memory arrays 14 may be segmented in a similar manner.

As will now be appreciated by those familiar with the art, the present invention may be embodied in other specific forms without departing from the spirit or essential characteristics thereof. For example, although a simple columnar arrangement of arrays is shown herein, other array arrangements (including matrices of arrays) may also be used so long as bootstrap circuits are shared between arrays. Other numbering schemes of arrays may also be used, so long as at least two arrays share bootstrap circuits. Further savings in area may be realized by sharing bootstrap circuits from, e.g., three arrays. While the shared bootstrap arrangement has been described for use in video memories, those skilled in the art will now recognize that the shared bootstrap arrangement of the present invention may be implemented in other memories as well so long as some provision is made to prevent word lines which share bootstrap circuits from being accessed at the same time. Further, while adjacent arrays are shown as sharing bootstrap circuits, arrays which are not physically or even logically adjacent may also share bootstrap circuits.

Accordingly, the disclosure of the invention is intended to be illustrative, but not limiting, of the scope of the invention which is set forth in the following claims.

What is claimed is:

1. A memory device, comprising:

at least a first and a second memory array, each having a plurality of word lines; and a plurality of word line bootstrap circuits, each of said word line bootstrap circuits coupled to a word line from said first memory array and to a word line from said second memory array.

2. The memory device of claim 1, further comprising:

at least a third and a fourth memory array, each having a plurality of word lines;

a second plurality of word line bootstrap circuits, each of said second plurality of word line bootstrap circuits coupled to a word line from said third memory array and a word line from said fourth memory array.

3. The memory device of claim 2, wherein data stored in said first and third arrays is stored for display on a first portion of a video display screen.

4. The memory device of claim 3, wherein data stored in said second and fourth arrays is stored for display on a second portion of a video display screen.

5. The memory device of claim 3 wherein said first portion of a video display screen is the top half of said screen.

6. A video memory device, comprising:

a plurality of memory arrays, each of said memory arrays identifiable by a sequentially numbered address, and each having a number of word lines; and a plurality of bootstrap circuits, each of said bootstrap circuits coupled to word lines from both an odd numbered one and an even numbered one of said memory arrays.

7. A method of displaying video information stored in a video memory having a plurality of memory arrays each having a number of word lines, the method comprising the steps of:

addressing said video memory by addressing a first word line in a first memory array;

boosting, using a first bootstrap circuit, a voltage level of said first wordline of said first array;

outputting, from said first memory array, first video information stored in memory cells along said first word line;

displaying said first video information on a first portion of a video screen;

addressing said video memory by addressing a second word line in a second memory array;

boosting, using said first bootstrap circuit, a voltage level of said second word line of said second memory array;

outputting, from said second memory array, second video information stored in memory cells along said second word line; and displaying said second video information on a second portion of said video screen.

* * * * *